United States Patent [19]

Kimock et al.

[11] Patent Number: 5,527,596
[45] Date of Patent: Jun. 18, 1996

[54] ABRASION WEAR RESISTANT COATED SUBSTRATE PRODUCT

[75] Inventors: Fred M. Kimock, Macungie; Bradley J. Knapp, Allentown; Steven J. Finke, Kutztown, all of Pa.

[73] Assignee: Diamonex, Incorporated, Allentown, Pa.

[21] Appl. No.: 149,646

[22] Filed: Nov. 8, 1993

Related U.S. Application Data

[63] Continuation-in-part of Ser. No. 589,447, Sep. 27, 1990, Pat. No. 5,135,808, and Ser. No. 924,297, Aug. 3, 1992, Pat. No. 5,268,217.

[51] Int. Cl.$^6$ .................................................. B32B 17/06
[52] U.S. Cl. .................... 428/216; 428/336; 428/408; 428/428; 428/432; 428/446; 428/698; 428/701; 428/702
[58] Field of Search ........................ 428/428, 432, 428/408, 336, 446, 698, 701, 702, 216

[56] References Cited

U.S. PATENT DOCUMENTS

| | | | |
|---|---|---|---|
| 4,060,660 | 11/1977 | Carlson et al. | 428/426 |
| 4,383,728 | 5/1983 | Litington | 350/1.7 |
| 4,400,410 | 8/1983 | Green et al. | 427/577 |
| 4,504,519 | 3/1985 | Zelez | 423/446 |
| 4,569,738 | 2/1986 | Kieser et al. | 427/574 |
| 4,597,844 | 7/1986 | Hiraki et al. | 428/408 |
| 4,603,082 | 7/1986 | Zelez | 428/408 |
| 4,647,494 | 3/1987 | Meyerson et al. | 428/408 |
| 4,661,409 | 4/1987 | Kieser et al. | 428/426 |
| 4,734,339 | 3/1988 | Schachner et al. | 428/698 |
| 4,746,538 | 5/1988 | Mackowski | 427/577 |
| 4,847,157 | 7/1989 | Goodman et al. | 428/212 |
| 4,849,290 | 7/1989 | Fujimori et al. | 428/408 |
| 4,877,677 | 10/1989 | Hirochi et al. | 428/216 |
| 4,907,846 | 3/1990 | Tustison et al. | 359/580 |
| 5,235,168 | 8/1993 | Bobba | 235/462 |

FOREIGN PATENT DOCUMENTS

| | | |
|---|---|---|
| 0161829 | 11/1985 | European Pat. Off. . |
| 243451 | 5/1987 | European Pat. Off. . |
| 0239280 | 10/1987 | European Pat. Off. . |
| 203903 | 11/1983 | Germany . |
| 204693 | 12/1983 | Germany . |
| 4201914A1 | 7/1992 | Germany . |
| 51-128686 | 11/1976 | Japan . |
| 59-26906 | 2/1984 | Japan . |
| 61-55603 | 3/1986 | Japan . |
| 61-106494 | 5/1986 | Japan . |
| 63-195266 | 8/1988 | Japan . |
| 63-221840 | 9/1988 | Japan . |
| 63-221841 | 9/1988 | Japan . |
| 64-2001 | 1/1989 | Japan . |
| 1147068 | 6/1989 | Japan . |
| 1147067 | 6/1989 | Japan . |
| 1006402A | 3/1983 | U.S.S.R. . |

OTHER PUBLICATIONS

Deutchman, et al., Proc. SPIE Int. Soc. Opt. Eng. 1146, 124–34 (1989).
Collins, et al., Proc. SPIE Int. Soc. Opt. Eng. 1146, 37–47 (1989).
Liou, et al., Proc. SPIE Int. Soc. Opt. Eng. 1146, 12–20.

(List continued on next page.)

*Primary Examiner*—A. A. Turner
*Attorney, Agent, or Firm*—Coudert Brothers

[57] ABSTRACT

The coated substrate product finds particular application in eyeglass and sunglass lenses, architectural glass, analytical instrument windows, automotive windshields and laser bar code scanners for use in retail stores and supermarkets. The product has greatly improved wear resistance for severe abrasive environments and comprises a substantially optically transparent substrate, one or more chemically vapor deposited interlayers bonded to the substrate and a chemically vapor deposited outer layer of optically transparent or substantially optically transparent hard and low friction material bonded to the interlayer and away from the substrate.

6 Claims, 2 Drawing Sheets

OTHER PUBLICATIONS

Bubenzer, et al., Proc. DARPA Workshop DLB Coat. (1982) issue date AD–A136766, 33–47, editor B. Bendow.

Stein, et al., NBS Spec. Publ. 638, 482–488 (1984).

Bubenzer, et al., NBS Spec. Publ. 638, 477–481 (1984).

Liou, et al., Appl. Phys. Lett., 55, 631–633 (1989).

Franks, J. Vac. Technol., A7, 2307–2310 (1989).

Nir, Thin Solid Films, 144, 201–209 (1986).

Joffreau, et al. "Low–Pressure Diamond Growth on Refractory Metals," *R & HM*, pp. 186–194 (1988).

Bubenzer, et al. "Rf–plasma deposited amorphous hydrogenated hard carbon thin films: Preparation, properties and applications," *J. Appl. Phys.*, vol. 54(8), pp. 4590–45945 (1983).

Final Program of American Vacuum Society 37th Annual Symposium in Toronto, Canada, cover & pp. 66–67 (Oct. 8–12, 1990).

Paper from aforementioned symposium: Samuel J. Holmes and V. Warren Ciricik, "Optical Properties and Intrinsic Coating Stresses In Ion Beam Sputter Deposited Silicon Oxynitride Films", Northrop Research and Technology Center (Oct. 8, 1990).

ABRASION WEAR RESISTANT COATED SUBSTRATE PRODUCT

This application is a Continuation-in-Part of application U.S. Ser. No. 07/589,447, filed Sep. 27, 1990, now U.S. Pat. No. 5,135,808, issued Aug. 4, 1992 (Docket No. 51247) and U.S. Ser. No. 07/924,297, filed Aug. 3, 1992 (Docket No. 52006) now U.S. Pat. No. 5,268,217.

FIELD OF THE INVENTION

This invention relates generally to coated substrate products. More particularly, the invention relates to a substantially optically transparent coated substrate product comprised of a parent substrate, one or more interlayers and a top coating layer of substantially optically transparent, hard and low friction material, and to a method for producing same.

BACKGROUND OF THE INVENTION

The properties of glass make it an ideal substrate material for use in many applications. In particular, the combination of optical transparency, with reasonable strength at a nominal cost, allows the widespread use of glass products. Glass, however, does suffer from several limitations. Glass is not a particularly hard material, and consequently it abrades in many applications. Additionally, glass is chemically reactive with many alkaline substances and with hydrofluoric acid. New applications and superior performance in existing applications could be thus realized for glass products if glass were more abrasion resistant and less chemically reactive. Examples of glass products which could benefit from improved abrasion resistance include eyeglass and sunglass lenses, architectural glass, analytical instrument windows, automotive windshields and laser bar code scanners for use in retail stores and supermarkets.

Diamond-like carbon films (DLC) are well known in the art and have been recognized as potential coatings to enhance the abrasion resistance of various substrate materials, including glass. The DLC coatings possess excellent optical properties and exhibit excellent resistance to abrasion and chemical attack by various acids, including hydrofluoric acid. However, it has been found that the DLC coatings will impart improved abrasion resistance to a substrate only if the adherence of the coating to the parent substrate is excellent.

The most obvious and common approach to coating the glass substrate is to apply the DLC coating directly onto a clean glass surface. However, this approach often results in a DLC coating which displays poor adhesion and therefore, poor abrasion resistance. DLC coatings are typically under significant compressive stress. This stress greatly affects the ability of the coating to remain adherent to the glass substrate. Additionally, glass often contains many alkali oxides and other additives which can inhibit the bonding of the $SiO_2$ in the glass to the carbon atoms in the DLC coating. It is currently believed that the reaction between the $SiO_2$ in glass and the DLC is essential for the coating to exhibit excellent adhesion. Therefore, less obvious methods are required to produce a glass substrate with a highly adherent DLC coating which provides excellent abrasion resistance.

In addition to glass substrates, many other optically transparent substrate materials, such as sapphire, glassy-ceramics, salts (NaCl, KBr, KCl, etc.), metal fluorides and metal oxides could benefit from a DLC coating, but contain elements which inhibit the bonding of the DLC layer.

Many methods for depositing DLC have been demonstrated, including radio frequency plasma deposition, ion beam sputter deposition from a carbon target, ion beam sputtered carbon with ion beam assist, direct ion beam deposition, dual ion beam deposition, laser ablation deposition from a carbon target, and ion beam assisted evaporation of carbon. Many of these prior art techniques have been used to deposit DLC on glass substrates, however, the emphasis of the prior art has not been on the adhesion of the DLC to the glass substrate or on the abrasion resistance of the coated substrate product. Illustrative are the following references: U.S. Pat. Nos. 4,746,538; 4,400,410; 4,383,728; 4,504,519; 4,603,082; 4,060,660; 4,877,677; 4,569,738 and 4,661,409; Japanese Patent Nos. 63/221841; 63/221840; 63/195266; 1147068; 1147067; 64-2001; 59-26906 and 51128686; European Patent Nos. DD-203903; SU1006402; Deutchman, et al.; Proc. SPIE-Int. Soc. Opt. Eng. 1146, 124–34, 1989; Collins, et al., Proc. SPIE-Int. Soc. Opt. Eng. 1146, 37–47, 1989; Liou, et al., Proc. PIE-Int. Soc. Opt. Eng. 1146, 12–20, 1989; Bubenzer, et al., Proc. DARPA Workshop Diamond-Like Carbon Coat., Meeting date 1982, Issue AD-A136 766, 33–47, edited by B. Bendow in NBS Spec. Publ. 669, 249–54, 1984; NBS Spec. Publ. 638, 482–82, 1984; Bubenzer, et al., NBS Spec. Publ. 638, 477–81, 1984; Appl. Phys. Lett. 55, 631–3, 1989; J. Vac. Sci. Technol A7, 2307–10, 1989; and D. Nir, Thin Solid Films, 144, 201–9, 1986. These references do not however describe the use of transparent interlayers to improve the adhesion of the amorphous carbon coating to the substrate or substantially optically transparent DLC coatings with greatly improved wear resistance for severe abrasive environments.

The application of low friction coatings, such as tin oxide, aluminum oxide, and boron nitride to optically transparent substrates such as glass is also known in the prior art. However, because these materials have conventionally been applied as thin layers, the wear resistance of the coated substrate in severe abrasive environments has been poor. Conventional tin oxide coatings on architectural glass or glass windows used in supermarket laser bar-code scanners constitute a prior art example of a low friction coating on a transparent glass substrate. In this case, the tin oxide coating (typically 2,000 Angstroms thick) provides an improvement in wear resistance relative to the uncoated glass substrate. However, this coating is neither hard enough, nor thick enough to provide wear resistance in severe abrasive environments. Consequently tin oxide-coated glass windows in supermarket laser bar-code scanners undergo severe abrasion and must be frequently replaced. Aluminum oxide coatings disclosed in European Patent Application #EPO 243541 (WO 87/02713) suffer from the same deficiencies.

Offenlegungsschrift DE 42 01 914 A1, having a United States priority date of Jan. 29, 1991, discloses and claims a scanner window consisting of a transparent substrate, a transparent hard material having a thickness in the range of 500 Angstroms to 10 microns on the substrate, and a transparent slippery top coat comprising DLC, diamond film, polytetrafluoroethylene (PTFE), polyethylene (PE), tin oxide, indium oxide, silicone polymers, boron nitride, aluminum oxide and mixtures thereof deposited on the hard material. Scanner windows that use hard materials in the disclosed lower range do not have sufficient wear and abrasion resistance and those which use the disclosed slippery polymers such as PTFE, PE, silicone polymers and mixtures do not have the desired balance of hardness and slipperiness to compete with those made in accordance with the present invention.

SUMMARY OF THE INVENTION

This invention provides a coated substrate product with superior abrasion wear resistance and reduced chemical reactivity. More particularly, this invention provides a coating of low friction diamond-like carbon, or other optically transparent or substantially optically transparent, hard and low friction materials to the surface of a substantially optically transparent substrate which is highly adherent and exhibits greatly improved wear resistance for severe abrasive environments. Still more particularly, this invention provides a coated substrate with improved ease of cleaning. This invention also provides a low cost and efficient process for producing a coated substrate product with superior abrasion wear resistance.

The disclosed abrasion wear resistant coated substrate product substantially reduces or eliminates the disadvantages and shortcomings associated with the prior art techniques. The invention discloses a substantially optically transparent composite structure which comprises a parent substrate, and at least one composite layer having a thickness of about 1 micron (µm) to about 20 µm and an outer layer of diamond-like carbon or other substantially optically transparent or optically transparent, hard and low friction material (herein referred to as a low friction material). Examples of other low friction materials include tin oxide, indium oxide, boron nitride, aluminum oxide, zirconium oxide, boron carbide, carbon nitride, molybdenum disulfide, mixtures thereof and chemically bonded combinations thereof. The invention also discloses a method for fabricating the coated substrate product.

According to the method, the substrate surface is initially chemically de-greased. In the second step, the substrate is bombarded with energetic gas ions to assist in the removal of residual hydrocarbons, as well as alkali metals and other additives. After the substrate surface has been sputter-etched, one or more interlayers are chemically vapor deposited on the substrate, followed by the deposition of a layer of optically transparent or substantially optically transparent, hard and low friction material. Once the requisite number of interlayers and the low friction top layer have been deposited, the coated substrate is cooled and removed from the reactor.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same parts or elements throughout the views, and in which.

DETAILED DESCRIPTION OF THE INVENTION

Figure 1:
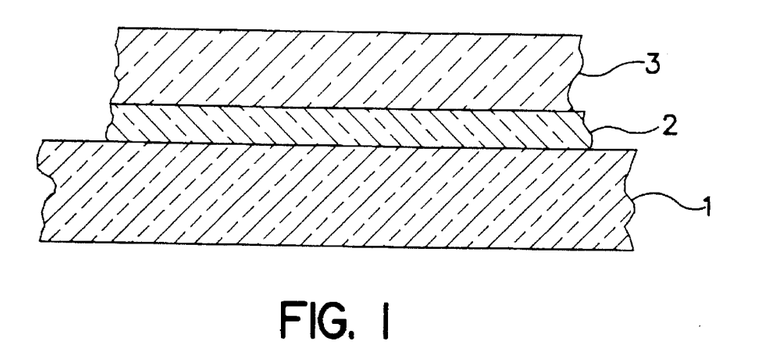
FIG. 1 is a cross-sectional view of the coated substrate product in accordance with the present invention.
Figure 2:
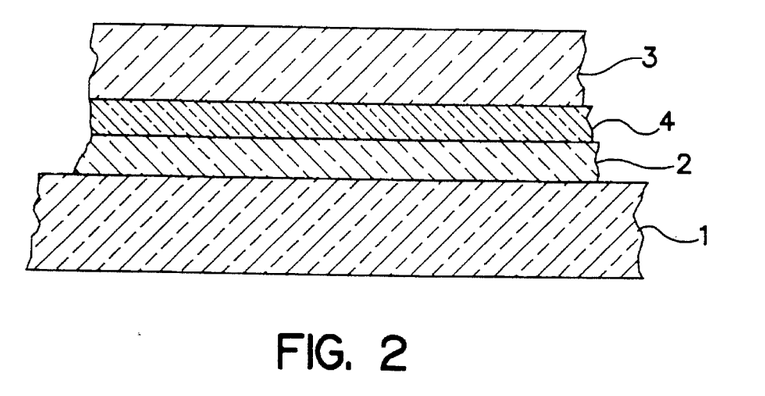
FIG. 2 is a cross-sectional view of the coated substrate product in accordance with a further embodiment of the prevent invention.
Figure 3:
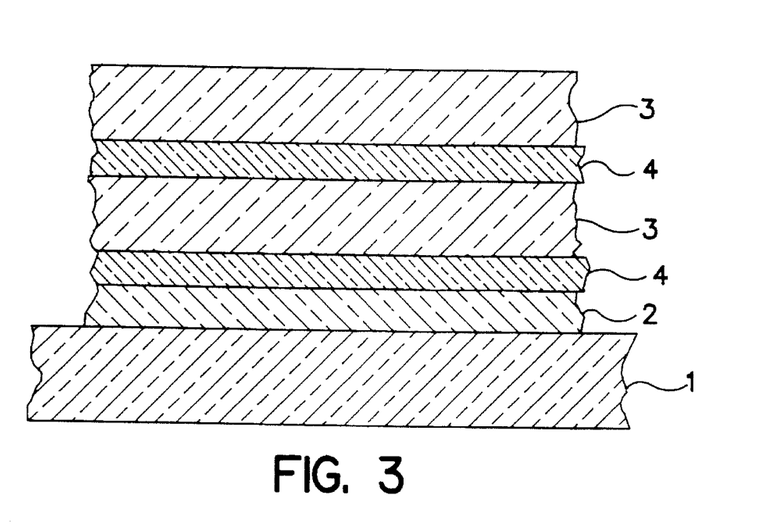
FIG. 3 is a cross-sectional view of the coated substrate product in accordance with a still further embodiment of the present invention.

In accordance with the present invention, the disclosed abrasion wear resistant coated substrate product substantially reduces or eliminates the disadvantages and shortcomings associated with the prior art techniques. As illustrated in FIGS. 1–3, the disclosed invention is a substantially optically transparent composite structure which comprises a parent substrate, one or more intermediate layers (interlayers) and a top layer of diamond-like carbon or other low friction material. By the term of "substantially optically transparent", it is intended to mean transparent to light in the visible region of the electromagnetic spectrum, which is generally between 350 nanometers and approximately 750 nanometers wavelength and having an integrated transmittance between 350 nanometers and approximately 750 nanometers of greater than approximately 10%. General purpose sunglasses are one example of a "substantially optically transparent" product. By the term of "optically transparent", it is intended to mean having an integrated transmittance between 350 nanometers and approximately 750 nanometers of greater than approximately 70%. By the term "hard", it is intended to mean having a hardness of greater than 200 kg/mm$^2$. By the term "low friction" is intended to mean having a coefficient of sliding friction of less than 0.3. A highly important technical advantage of the invention is that the resultant multilayer composite structure produces a highly abrasion wear resistant surface on various substrate materials, particularly glass.

In certain optical products, such as sunglasses, architectural glass, and filters for use in analytical instrumentation, it is advantageous to reduce the transmittance of visible light over specified wavelength ranges, while still maintaining some minimum amount of visible light transmittance. For applications such as these, the use of "substantially optically transparent" materials is appropriate.

For the majority of products used to transmit visible light, an integrated optical transmittance over the wavelength of 350 nm to approximately 750 nanometers greater than 50% is preferred. In this case, some materials fitting the definition of substantially optically transparent cannot be used, and the use of "optically transparent" materials is preferred. For applications which require an integrated visible optical transmittance over the wavelength of 350 nm to approximately 750 nanometers of greater than 70%, the use of "optically transparent" materials is most preferred. Watch crystals and eyeglass lenses are examples of products requiring the use of optically transparent materials.

The degree of optical transmittance of a material is determined by thickness, absorption coefficient, and reflectance. It is important to note that the stoichiometry, and chemical bonding in materials can be modified by variation of deposition process parameters. In this way, a material which is "optically transparent" in its normal stoichiometric form (e.g. aluminum oxide, $Al_2O_3$) can be made "substantially optically transparent" by slight alterations in stoichiometry (e.g. AlO). While slight alterations in stoichiometry can lead to significant changes in optical properties, these variations often result in a minimal or negligible effect on the other physical or tribological properties of a material. Thus, the optically transparent, hard and low friction layers of the present invention can be modified, as required by the application, to become substantially optically transparent, while still maintaining their advantageous properties of hardness and low friction.

In the preferred embodiment form of the invention, as illustrated in FIG. 1, a first interlayer 2 (or adhesion-mediating layer) is chemically vapor deposited onto a parent substrate 1 which comprises a substantially optically transparent amorphous material, a single crystal, polycrystalline materials, glass, salt materials, ceramic materials and/or mixtures thereof. By the term of "chemically vapor deposited", it is intended to mean materials deposited by vacuum deposition processes, including thermal evaporation, electron beam evaporation, magnetron sputtering, ion beam sputtering from solid precursor materials; thermally-activated deposition from reactive gaseous precursor materials; glow discharge, plasma, or ion beam deposition from gaseous precursor materials. Preferably, the first interlayer 2 is deposited onto the parent substrate 1 by ion beam or magnetron sputtering.

Atmospheric pressure deposition methods including arc-spray or plasma-spray deposition from gaseous or solid precursor materials, or thermally-activated deposition from reactive gaseous precursor materials may additionally be employed to deposit the first interlayer 2.

The first interlayer 2 generally comprises a substantially optically transparent material devoid of alkali metal atoms and fluorine, and capable of forming a strong chemical bond to the substrate 1 and the low friction diamond-like carbon layer 3. By the phrase of "strong chemical bond to the diamond-like layer", it is intended to mean that the interlayer is composed of a significant amount of an element or elements which are capable of undergoing a chemical reaction with carbon to form carbide-bonding. The absence of alkali metals and fluorine is essential to achieve a highly adherent interface between the first interlayer 2 and the diamond-like carbon layer 3. Thus, the first interlayer 2 must also have the property of providing a barrier to diffusion of alkali metals and additives from the parent substrate 1 to the diamond-like carbon layer 3. In the preferred embodiment form of the invention, the first interlayer comprises silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof and chemically bonded combinations thereof when layer 3 is composed of diamond-like carbon. By the term "oxide", it is intended to mean a stoichiometrically oxidized material, or a partially oxidized material which contains excess metal atoms, or is deficient in oxygen. By the term "nitride", it is intended to mean a material composed of a stoichiometric amount of nitrogen or a material which either contains excess nitrogen atoms, or is deficient in nitrogen. By the term "carbide", it is intended to mean a material composed of a stoichiometric amount of carbon or a material which either contains excess carbon atoms, or is deficient in carbon.

By the term "chemically bonded combinations" it is intended to mean a combination of at least two of the foregoing materials which are joined by chemical bonds, e.g. silicon oxide and silicon nitride to form silicon oxynitride.

In the case of a single interlayer, first interlayer 2 ranges from approximately 1 μm to 20 μm in thickness. Preferably, the first interlayer 2 is from about 5 Å thick to about 1 μm in those cases in which there are at least one other interlayer.

Following deposition of the first interlayer 2 onto the parent substrate 1, the low friction diamond-like carbon layer 3 is chemically vapor deposited onto the coated substrate. The diamond-like carbon layer 3 can be from 10 Å to 20 μm in thickness. Preferably, the diamond-like carbon layer 3 is at least 50 Å thick.

To further enhance the abrasion wear resistance of the structure, more than one interlayer or a plurality of alternating interlayers and diamond-like carbon layers 3 may be deposited onto the parent substrate 1. It has been found that this arrangement allows for the deposition of a greater total thickness of DLC material, which provides a further increase in abrasion resistance. Thus, in further envisioned embodiments of the invention, not shown, the structure may comprise a parent substrate 1, two different and separately deposited first interlayers 2 and a diamond-like carbon layer 3; or a parent substrate 1 and two or more pairs of first interlayers 2 and diamond-like carbon layers 3.

It has unexpectedly been found that in severe wear environments, the abrasion resistance of the coated substrate product can be dramatically improved by using a relatively thick, e.g. in the range of about 1 μm to about 20 μm, first interlayer 2 between parent substrate 1 and low friction DLC layer 3. Such a highly abrasion wear resistant and corrosion resistant coated substrate product is obtained by depositing such a relatively thick film of at least one interlayer 2 having a hardness greater than that of substrate 1 and then depositing a comparatively thin, e.g. at least 50 Å, layer of DLC as the top coat. In addition to serving as the bonding layers between substrate 1 and DLC top layer 3, interlayer(s) 2 provide a hard "structural support layer" for DLC layer 3. The thinner DLC top most layer provides a low friction, corrosion-resistant, protective surface for the substrate. The resulting coated substrate product has greater commercial utility than similar products in which the substrate is deposited with thin interlayer(s) 2 followed by a relatively thick DLC layer 3 in the following two cases. The first case is if the optical absorption coefficient of DLC layer 3 is too high to allow a thick DLC layer to be deposited while simultaneously meeting stringent optical transparency requirements for the coated product. The second case is if the deposition rate of DLC layer 3 is much lower than that of interlayer(s) 2, using a thick interlayer 2 to achieve the required degree of abrasion resistance is more economical than using a thick DLC layer 3.

It has also been unexpectedly found that low friction materials other than diamond-like carbon can be applied as top layers over the relatively thick interlayers to produce a product with dramatically improved wear resistance in severe abrasive environments. In this case, a low friction material chosen from tin oxide, indium oxide, aluminum oxide, zirconium oxide, boron nitride, boron carbide, molybdenum disulfide, carbon nitride, mixtures thereof and chemically bonded combinations thereof, or other optically transparent or substantially optically transparent, hard and low friction materials is deposited as the top layer 3 over interlayers in the thickness range of 1 μm to approximately 20 μm, which have been deposited onto the parent substrate. A highly abrasion wear resistant coated substrate product is obtained by depositing such a relatively thick film of at least one interlayer 2 having a hardness greater than that of substrate 1 and then depositing a comparatively thin, e.g. at least 50 Å, layer of low friction material as the top coat. In addition to serving as the bonding layers between substrate 1 and the low friction top layer 3, interlayer(s) 2 provide a hard "structural support layer" for low friction layer 3. The thinner top layer 3 provides a low friction, protective surface for the substrate. The use of low friction layers of tin oxide, indium oxide, aluminum oxide, zirconium oxide, boron nitride, boron carbide, molybdenum disulfide, carbon nitride, mixtures thereof and chemically bonded combinations thereof, or other optically transparent or substantially optically transparent, hard and low friction materials is advantageous compared to the use of diamond-like carbon in the following two situations. The first situation is one in which the special deposition equipment (ion beam source, plasma source, laser deposition source, and the like)

required for the production of diamond-like carbon is not available. The second situation is if the optical absorption coefficient of a DLC layer is too high to allow the required thickness of DLC to be used while meeting stringent optical transparency requirements for the coated product. For example, this situation can be encountered even for very thin (i.e. 100 Å thick) DLC layers when an optically "water clear" coating is required. Normally, application of DLC layers even as thin as 100 Å will cause a yellow, orange, or light brown coloration of the coated substrate when viewed in transmission.

A key feature of the present invention is that the low friction materials are specified not be from the class of materials generally known in the prior art as "polymers." Examples of low friction polymer materials include polyethylene, polytetrafluoroethylene (PTFE) ("Teflon®") and conventional silicone polymers. All of the conventional low friction polymer materials are soft by comparison to the low friction layers of the present invention. Because of their low hardness, these polymer materials are susceptible to damage by scratching or scraping off of the interlayer, hence a coated product with improved abrasion resistance in severe abrasive environments is not achieved.

In the case in which low friction layer 3 is composed of tin oxide, indium oxide, aluminum oxide, zirconium oxide, boron nitride, boron carbide, molybdenum disulfide, carbon nitride, mixtures thereof and chemically bonded combinations thereof, or other optically transparent or substantially optically transparent, hard and low friction materials, then interlayer 2 may comprise a substantially optically transparent material of silicon nitride, titanium nitride, tantalum nitride, hafnium nitride, zirconium nitride, boron nitride, yttrium oxide, germanium oxide, silicon dioxide, tantalum oxide, titanium oxide, zirconium oxide, hafnium oxide, silicon oxide, silicon carbide, germanium carbide, aluminum oxide, aluminum nitride, cerium oxide, tin oxide, indium oxide, thorium oxide, lithium oxide, sodium oxide, potassium oxide, rubidium oxide, cesium oxide, francium oxide, beryllium oxide, magnesium oxide, calcium oxide, strontium oxide, cerium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof and chemically bonded combinations thereof. Because of their high hardness, materials for interlayer 2 are preferably silicon nitride, zirconium nitride, boron nitride, yttrium oxide, silicon oxide, silicon dioxide, zirconium oxide, silicon carbide, aluminum oxide, aluminum nitride, mixtures thereof and chemically bonded combinations thereof. Most preferably, interlayer 2 is composed of silicon oxy-nitride. In no case would the low friction layer 3 and the interlayer 2 which is bonded directly to low friction layer 3 be chosen from the same material.

In another embodiment of the invention, as illustrated in FIG. 2, a second interlayer 4 is chemically vapor deposited onto the coated substrate and positioned such that the second interlayer 4 is disposed between the first interlayer 2 and the low friction diamond-like carbon layer 3. The second interlayer 4 would similarly comprise a substantially optically transparent material devoid of alkali metal atoms and fluorine, and capable of forming a strong chemical bond to the first interlayer 2 and the low friction diamond-like carbon layer 3. The second interlayer may comprise a substantially optically transparent silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof and chemically bonded combinations thereof when the low-friction layer 3 is diamond-like carbon.

Since the second interlayer 4 provides a diffusion barrier for alkali metal atoms, fluorine and/or any additional additives which would adversely effect the adherence of the low friction diamond-like carbon layer 3, the first interlayer could further comprise a substantially optically transparent aluminum oxide, cerium oxide, tin oxide, indium oxide, thorium oxide, lithium oxide, sodium oxide, potassium oxide, rubidium oxide, cesium oxide, francium oxide, beryllium oxide, magnesium oxide, calcium oxide, strontium oxide, cerium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof and chemically bonded combinations thereof.

In yet another embodiment of the invention, if low friction layer 3 is composed of tin oxide, indium oxide, aluminum oxide, zirconium oxide, boron nitride, boron carbide, molybdenum disulfide, carbon nitride, mixtures thereof and chemically bonded combinations thereof, or other substantially optically transparent, hard and low friction materials, then interlayers 2 and 4 may comprise a substantially optically transparent material of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, aluminum nitride, cerium oxide, tin oxide, indium oxide, thorium oxide, lithium oxide, sodium oxide, potassium oxide, rubidium oxide, cesium oxide, francium oxide, beryllium oxide, magnesium oxide, calcium oxide, strontium oxide, cerium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof and chemically bonded combinations thereof. Because of their high hardness, materials for interlayers 2 and 4 are preferably silicon nitride, zirconium nitride, boron nitride, yttrium oxide, silicon oxide, silicon dioxide, zirconium oxide, silicon carbide, aluminum oxide, aluminum nitride, mixtures thereof and chemically bonded combinations thereof. Most preferably, interlayer 2 and/or interlayer 4 is composed of silicon oxy-nitride. In no case would the low friction layer 3 and the interlayer which is bonded directly to low friction layer 3 be chosen from the same material.

The second interlayer 4 can be from 5 Å to 20 μm in thickness. Preferably, second interlayer 4 is at least 10 Å thick. Still more preferably, second interlayer 4 has a thickness in the range of 1 μm to 20 μm in the case in which the thickness of first interlayer(s) 2 is in the 5 Å to 1 μm range, or second interlayer 4 has a thickness in the range of 5 Å to 1 μm in the case in which the thickness of first interlayer(s) 2 is in the 1 μm to 20 μm range to achieve the unexpected results of greatly improved abrasion resistance in severe wear environments for the coated substrate product.

To further enhance the abrasion wear resistance of the coating structure, more than one interlayer, or a plurality of interlayers, with an optically transparent or substantially optically transparent, hard, and low friction outer layer 3 may be deposited onto the parent substrate 1. In this way, it is often possible to deposit a grater total thickness of hard interlayer material, while maintaining good adhesion of the coating, providing a further increase in abrasion resistance.

One example of this would be a glass substrate coated with a 1,000 Å thick first interlayer of silicon dioxide, then three pairs of alternating layers of 0.5 µm thick silicon oxy-nitride and 0.5 µm thick aluminum oxide (silicon oxy-nitride/ aluminum oxide/silicon oxy-nitride/aluminum oxide/silicon oxy-nitride/aluminum oxide), followed by a 500 Å thick top layer of optically transparent tin oxide. In this case, although each individual interlayer is less than 1 µm thick, the sum total thickness of all the interlayers is 3.1 µm, and the composite coating layer thickness is 3.15 µm, resulting in a product with improved wear resistance in severe abrasive environments according to the present invention. Similarly, each of the silicon oxy-nitride and aluminum oxide layers above could be grater than 1 µm thick, so that the sum total thickness of all the interlayers is 6.1 µm, and the composite coating layer thickness is 6.15 µm, resulting in a product with even further improved wear resistance in severe abrasive environments. Thus, in further envisioned embodiments of the invention, not shown, the coating layer structure may comprise a parent substrate 1, two or more different and separately deposited interlayers (2,4) and a low friction outer layer 3; or a parent substrate 1 a first interlayer 2, two or more pairs of interlayers (4) and a low friction outer layer 3.

In the case where the low friction layer 3 is diamond-like carbon, the second interlayer 4 may alternatively comprise a substantially optically transparent metallic material capable of reflecting visible light and capable of forming a strong chemical bond with the first interlayer 2 and the low friction diamond-like carbon layer 3, selected from the following two groups. In the first group, the metallic material may consist of silicon, germanium, hafnium, molybdenum, tungsten, yttrium, tantalum, titanium and zirconium. These metallic materials all form a strong chemical bond to the low friction diamond-like carbon layer 3.

The second group of metallic materials comprises vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium. Among the second group of metallic materials, rhenium, iridium, tin, indium, aluminum, nickel, iron, chromium, copper, gold, silver and platinum are preferable as second interlayer 4. Although these materials will provide a diffusion barrier to alkali metal atoms and fluorine, they will not form a strong carbide bond with the low friction diamond-like carbon layer 3. Therefore, if any of these second group metallic materials are selected for the second interlayer 4, a third interlayer (not shown) must be disposed between the second interlayer 4 and the low friction diamond-like carbon layer 3. The third interlayer would similarly comprise a substantially optically transparent material devoid of alkali metal atoms and fluorine and selected from the group consisting of silicon nitride, titanium nitride, tantalum nitride, hafnium nitride, zirconium nitride, boron nitride, yttrium oxide, geranium oxide, hafnium oxide, silicon oxide, silicon dioxide, tantalum oxide, titanium oxide, zirconium oxide, silicon carbide, germanium carbide, mixtures thereof, and chemically bonded combinations thereof. Although it is not necessary, this third interlayer may be employed with the aforementioned first group of metallic materials.

In the case where the low friction top layer 3 is composed of tin oxide, indium oxide, aluminum oxide, zirconium oxide, boron nitride, boron carbide, molybdenum disulfide, carbon nitride, mixtures thereof and chemically bonded combinations thereof or other optically transparent or substantially optically transparent, hard, and low friction materials, substantially optically transparent metallic materials selected for interlayer 4 may comprise silicon, germanium, hafnium, molybdenum, tungsten, yttrium, tantalum, titanium, zirconium, vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium. Among these metallic materials, rhenium, iridium, tin, indium, aluminum, nickel, iron, chromium, copper, gold, silver, platinum, silicon, germanium, molybdenum, tungsten, titanium, tantalum, and zirconium are preferred.

The metallic second interlayer 4 can be from 5 Å to 1000 Å in thickness. Preferably, the metallic second interlayer 4 is at least 10 Å thick.

In yet another embodiment or the invention, as illustrated in FIG. 3, the embodiment illustrated in FIG. 2 and discussed above is provided with a second composite layer comprising a first interlayer 2 and a low friction diamond-like carbon layer 3. The resultant multilayer structure would thus be a parent substrate 1, a first interlayer 2, a second interlayer 4, a diamond-like carbon layer 3, a first interlayer 2 and a diamond-like carbon layer 3. The structure may alternatively comprise a parent substrate 1, two first interlayers 2, a diamond-like carbon layer 3, a first interlayer 2 and a diamond-like carbon layer.

By choosing the appropriate interlayer 2, 4 and low friction diamond-like carbon layer 3 thicknesses, criteria which are known in the art of optical coating design could be employed in each of the aforementioned embodiments of the present invention to produce quarter wavelength stacks and other "dielectric stack" coating configurations. In these dielectric stack configurations, optical interference effects could be used to produce wavelength-selective mirrors or anti-reflection films. By choosing the appropriate thickness of at least one of the interlayers 2, 4 and diamond-like carbon layer 3, the reflection of light at predetermined wavelength ranges may be either minimized or maximized. Superior abrasion wear resistance and environmental durability currently unavailable with conventional optical coatings could thus be realized by the incorporation of the dielectric stack configurations into the present invention.

The method of the present invention teaches those skilled in the art how to fabricate the transparent abrasion wear resistant coated substrate product. According to the method, the first step involves chemically de-greasing the surface of the parent substrate 1. The substrate 1 is then placed into a chemical vapor deposition reactor vacuum chamber and the air evacuated from the chamber to less than approximately $5 \times 10^{-6}$ Torr.

In the next step the surface of the substrate 1 is sputter etched with energetic ions or atoms to assist in the removal of residual hydrocarbons, as well as alkali metals and other additives which are commonly present on the surface of the substrate materials, particularly glass. It has been found that the concentration of alkali metals (Na, Ca) at the surface of glass substrates was significantly reduced as a function of ion sputter-etching time and that increased sputter-etching time substantially improved the adhesion of the low friction diamond-like carbon layer 3. [See Examples A–Z]. Therefore, it is concluded that the removal of alkali metals and other additives is essential to a achieve a highly adherent interface between parent substrate 1 and the low friction diamond like carbon layer 3.

The sputter-etching may be performed with a beam of inert gas ions, hydrogen ions or oxygen ions, a glow discharge or a plasma of inert gas, hydrogen or oxygen. In the preferred embodiment form of the invention, sputter-etching is performed with a beam of energetic gas ions at an energy of at least 200 eV.

Following the sputter-etching step one or more interlayers are chemically vapor deposited onto the parent substrate 1. During a first cycle any of the aforementioned conventional chemical vapor deposition methods may be employed to deposit the interlayers 2, 4 (FIGS. 2 & 3). The deposition rate of each interlayer 2,4 is generally in the range of about 0.1–10 microns/hour. The total thickness of each interlayer can be in the range of about 5 Å to 20 µm. In the preferred embodiment of the invention, the thickness of at least one interlayer is in the range of about 1 µm to 20 µm and the total thickness for each of the other interlayers is at least 10 Å.

After the chemical vapor deposition of one or more interlayers onto the parent substrate 1, a low friction layer 3 is deposited onto the coated substrate. Diamond-like carbon layer 3 can be deposited by the following conventional methods: (i) direct ion beam deposition, dual ion beam deposition, glow discharge, RF-plasma, DC-plasma, or microwave plasma deposition from a carbon-containing gas or a carbon-containing vapor which can also be mixed with hydrogen, nitrogen-containing gases, oxygen containing gases and/or inert gas, (ii) electron beam evaporation, ion-assisted evaporation, magnetron sputtering, ion beam sputtering, or ion-assisted sputter deposition from a solid carbon target material, or (iii) combinations of (i) and (ii).

In the preferred embodiment form of the invention, the low friction diamond-like carbon layer(s) is deposited by ion beam deposition from a hydrocarbon gas or carbon vapor. The ion beam deposition may also be performed in combination with an inert gas or hydrogen.

Low friction layers of tin oxide, indium oxide, aluminum oxide, zirconium oxide, boron nitride, boron carbide, molybdenum disulfide, carbon nitride, mixtures thereof and chemically bonded combinations thereof, or other optically transparent or substantially optically transparent, hard and low friction materials can be deposited by the following methods: (i) direct ion beam deposition, glow discharge, RF-plasma, DC-plasma, or microwave plasma deposition from vapors composed at least partially of the elements contained in the low friction layers, (ii) electron beam evaporation, ion-assisted evaporation, magnetron sputtering, ion beam sputtering, or ion-assisted sputter deposition from a solid target material, or (iii) combinations of (i) and (ii). In the preferred embodiment form of the invention, the low friction layers are deposited by ion-assisted evaporation, magnetron sputtering, or ion beam sputtering.

The deposition rate of the low friction layer 3 is generally in the range of about 0.1–10 microns/hour. The total thickness of the low friction layer is generally in the range of about 10 Å to 20 µm. If the thickness of low friction layer 3 is greater than approximately 1 micron, then the hardness of layer 3 should be greater than the hardness of the substrate material. Preferably, the thickness of the low friction layer 3 is at least 50 Å thick.

After the deposition of the appropriate interlayers and low friction layer(s) 3, as detailed in the aforementioned embodiments, the coated substrate product is cooled by extinguishing the deposition process and passing an inert gas over the substrate until it has reached substantially room temperature. The coated substrate product, exhibiting superior abrasion wear resistance, is then removed from the reactor.

The examples which follow illustrate the superior performance of the invention. The examples are for illustrative purposes only and are not meant to limit the scope of the claims in any way.

EXAMPLE A

A 2"×2"×0.375" thick float glass plate was cut from a glass bar code scanner window and coated by the following procedure. The glass plate was chemically cleaned by trichloromethane followed by methanol solvents in an ultrasonic bath. The sample was removed and blown dry with nitrogen gas. The glass plate was then mounted onto a substrate holder and part of the substrate surface was masked. The sample was then inserted into a vacuum chamber which was then evacuated to $8\times10^{-7}$ Torr. The sample was sputter-etched for 1 minute by a beam of $Ar^+$ ions at an energy of 500 ev and a current density of 0.5 mA/cm$^2$. The sample was then coated by direct ion beam deposition using an 11 cm ion beam source operated on $CH_4$ gas at a pressure of $7.2\times10^{-5}$ Torr. The ion energy was 75 eV and the ion beam current density was 0.30 mA/cm$^2$. A transparent coating of 3000 Å thickness was deposited. The sample was removed and scratch-tested by rubbing a sharp piece of glass or a glass jar across the interface between the coated and uncoated (masked) areas. While the uncoated area showed deep and wide scratches, no scratches were observed on the DLC-coated area. The coating was tested for adhesion by alternately immersing the sample in baths of boiling water (for 2 minutes) and ice water (for 2 minutes). After one thermal cycle, the coating peeled off of the glass substrate.

EXAMPLE B

A 2"×2"×0.375" thick float glass plate was chemically cleaned, mounted, masked, and ion sputter-etched in vacuum for 10 minutes by the procedure described in Example A. Next, a 100-Å thick layer of $SiO_2$ was deposited onto the glass plate by $Ar^+$ ion beam sputter deposition from a quartz target. Then, a diamond-like carbon layer of 3,000 Å thickness was deposited by the method described in Example A. The coating could not be scratched when rubbed by a sharp piece of glass or a glass jar. The coating remained adherent after 5 thermal cycles between boiling water and ice water.

EXAMPLE C

A 2"×2"×0.375" thick float glass plate was chemically cleaned, mounted, masked, and ion sputter-etched in vacuum by the procedure described in Example B. Next, a 1,000-Å thick layer of $SiO_2$ was deposited onto the glass plate by $Ar^+$ ion beam sputter deposition from a quartz target. Then, a diamond-like carbon layer of 3,000 Å thickness was deposited by the method described in Example A. The coating could not be scratched when rubbed by a sharp piece of glass or a glass jar. The coating remained adherent after 5 thermal cycles between boiling water and ice water.

EXAMPLE D

A 2"×2"×0.375" thick float glass plate was chemically cleaned, mounted, masked, and ion sputter-etched in vacuum by the procedure described in Example B. Next, a the coating described in Example B was repeated three times in sequence, so the total coating thickness deposited onto the glass plate was 9,300 Å. The coating could not be scratched when rubbed by a sharp piece of glass or a glass jar. The coating remained adherent after 5 thermal cycles between boiling water and ice water.

EXAMPLE E

A 2"×2"×0.375" thick float glass plate was chemically cleaned, mounted, masked, and ion sputter-etched in vacuum by the procedure described in Example A, except the sputter-etching time was 5 minutes. Next, a 800 Å thick layer of $Al_2O_3$ was deposited onto the glass plate by $Ar^+$ ion beam sputter deposition from an aluminum oxide target. Then, a diamond-like carbon layer of 200 Å thickness was deposited by the method described in Example A. The coating could not be scratched when rubbed by a sharp piece of glass. After 24 hours, the coating peeled off the substrate.

EXAMPLE F

A 1" diameter×0.06" thick soda lime glass disk was chemically cleaned, mounted, masked, and ion sputter-etched in vacuum by the procedure described in Example A. Next, a 10,000 Å thick layer of $Al_2O_3$ was deposited onto the glass plate by $Ar^+$ ion beam sputter deposition from an aluminum oxide target. Then, a 300-Å thick layer of $SiO_2$ was deposited over the $Al_2O_3$ layer by $Ar^+$ ion beam sputter deposition from a quartz target. Next, a diamond-like carbon layer of 200 Å thickness was deposited by the method described in Example A. The coating could not be scratched when rubbed by a sharp piece of glass. After 5 thermal cycles between boiling water and ice water, the coating remained adherent.

EXAMPLE G

A 6"×6"×0.375" thick float glass plate was initially coated with about 2,000 Å of $SnO_2$ by thermally activated deposition from an organo-tin compound. The plate was then chemically cleaned by the procedure described in Example A, mounted, masked, and installed into a vacuum chamber which was then evacuated to $3.5 \times 10^{-6}$ Torr. The sample was sputter-etched for 2 minutes by a beam of $Ar^+$ ions at an energy of 500 eV and a current density of 0.5 mA/cm². Next, a 1,000-Å thick layer of $SiO_2$ was deposited over the $SnO_2$ layer by $Ar^+$ ion beam sputter deposition from a quartz target. Then, a diamond-like carbon layer of 2,000 Å thickness is deposited by the method described in Example A. After 5 thermal cycles between boiling water and ice water, the coating remained adherent.

EXAMPLE H

A 6"×6"×0.375" thick float glass plate coated with about 2,000 Å of $SnO_2$ was chemically cleaned by the procedure described in Example A, mounted, masked, and installed into a vacuum chamber which was then evacuated to $6 \times 10^{-7}$ Torr. The sample was sputter-etched for 2 minutes by a beam of $Ar^+$ ions at an energy of 500 eV and a current density of 0.5 mA/cm². Then, a diamond-like carbon layer of 2,000 Å thickness was deposited by the method described in Example A. During deposition, the DLC coating began to peel off of the substrate, indicating poor adhesion.

EXAMPLE I

A 27 mm diameter×2 mm thick sapphire window was ultrasonically cleaned in trichloromethane, followed by acetone, and then methanol, and blown dry with nitrogen gas. The sapphire sample was mounted into the vacuum coating system and, after evacuation, sputter-etched for 3 minutes as described in Example A. Then, a 1000-Å thick layer of diamond-like carbon was deposited onto the sapphire substrate using the conditions described in Example A. A powdery carbon material was observed on the surface of the substrate upon removal from the coating chamber indicating that the coating was not adherent.

EXAMPLE J

A 27 mm diameter×2 mm thick sapphire window was cleaned, mounted into a vacuum coating system, evacuated, and sputter-etched for 1 minute using the conditions described in Example A. Then, a 100-Å thick layer of $SiO_2$ was deposited onto the sapphire substrate using the conditions described in Example B. Next, a transparent, 1000-Å thick layer of diamond-like carbon was deposited onto the sapphire substrate using the conditions described in Example A. The diamond-like carbon coating was very adherent, and could not be scratched with 50-micron quartz powder.

EXAMPLE K

A 27 mm diameter×2 mm thick sapphire window was cleaned, mounted into a vacuum coating system, evacuated, and sputter-etched for 1 minute using the conditions described in Example A. Then, a 50-Å thick layer of Si was deposited onto the sapphire substrate by $Ar^+$ ion beam sputter deposition from a Si target. Next, a transparent, 1000-Å thick layer of diamond-like carbon was deposited onto the sapphire substrate using the conditions described in Example A. Subsequent optical spectroscopy analysis of the coating revealed that the Si layer had been converted into a transparent layer of SiC by this process. The diamond-like carbon coating was very adherent, and could not be scratched with 50-micron quartz powder.

EXAMPLE L

A 130 mm diameter×1 mm thick aluminosilicate disk was mounted into a vacuum coating system, evacuated, and sputter-etched for 5 minutes, using the conditions described in Example A. Then, a 100-Å thick layer of $SiO_2$ was deposited onto the aluminosilicate substrate using the conditions described in Example B. Next, a 150-Å thick layer of diamond-like carbon was deposited onto the aluminosilicate substrate using the conditions described in Example A. The coating was very adherent, and could not be scratched with a sharp piece of glass.

EXAMPLE M

A 5.5"×5.5"×0.18" thick plate of Corning Code #9984-Pyroceram® (Note: Pyroceram® is a glass/ceramic material composed at least of rutile, aluminum oxide, and magnesium silicate.) was cleaned in isopropyl alcohol, blown dry with nitrogen gas, mounted into a vacuum coating system, evacuated, and sputter-etched for 15 minutes using the conditions described in Example A. Then, a 200-Å thick layer of $SiO_2$ was deposited onto the substrate as described in Example B. Next, a transparent, 2000-Å thick layer of diamond-like carbon was deposited onto the substrate using the conditions described in Example A. The coating was very adherent, and could not be scratched by a sharp piece of glass.

EXAMPLE N

A 5.5"×5.5"×0.18" thick plate of borosilicate glass was cleaned in isopropyl alcohol, blown dry with nitrogen gas, mounted into a vacuum coating system, evacuated, and sputter-etched for 15 minutes using the conditions described in Example A. Then, a 200-Å thick layer of $SiO_2$ was deposited onto the substrate as described in Example B. Next, a transparent, 2000-Å thick layer of diamond-like carbon was deposited onto the substrate using the conditions described in Example A. The coating was very adherent, and could not be scratched by a sharp piece of glass.

EXAMPLE O

A 2"×2"×¼" thick piece float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 100-Å thick layer of $SiO_2$ was deposited onto the substrates using the conditions described in Example B. Next, a 100-Å thick layer of Si was deposited on top of the $SiO_2$ layer by $Ar^+$ ion beam sputter deposition from a Si target. Finally, a 1,000-Å thick layer of transparent diamond-like carbon was deposited on top of the Si layer using the conditions described in Example A. The coating was very adherent, and could not be scratched with a sharp piece of glass which could easily scratch the un-coated glass substrates. The coating on the sunglass lens exhibited an intense blue-purple reflected color.

EXAMPLE P

A 2"×2"×¼" thick piece of float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 100-Å thick layer of $SiO_2$ was deposited onto the substrates using the conditions described in Example B. Next, a 100-Å thick layer of Cr metal was deposited by $Ar^+$ ion beam sputter deposition from a Cr target. Next, a second 100-Å thick layer of $SiO_2$ was deposited on top of the Cr layer. Finally, a 1,000-Å thick layer of transparent diamond-like carbon was deposited on top of the $SiO_2$ layer using the conditions described in Example A. The coating was very adherent, and could not be scratched with a sharp piece of glass which could easily scratch the un-coated glass substrates. The coating on the sunglass lens exhibited a bright blue reflected color.

EXAMPLE Q

An adherent, abrasion-resistant quarter-wavelength stack reflecting coating was formed on glass substrates. The layer thicknesses were chosen to maximize reflectance at a wavelength of 450 nanometers. The refractive index of the deposited $SiO_2$ layers was about 1.5, and the refractive index of the deposited DLC layers was about 2.05. The coating was formed as follows:

A 2"×2"×¼" thick piece of float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 750-Å thick layer of $SiO_2$ was deposited onto the substrates using the conditions described in Example B. Next, a 550-Å thick layer of transparent diamond-like carbon was deposited on top of the first $SiO_2$ layer using the conditions described in Example A. Next, a 750-Å thick layer of $SiO_2$ was deposited on top of the first DLC layer using the conditions described in Example B. Finally, a 550-Å thick layer of transparent diamond-like carbon was deposited on top of the second $SiO_2$ layer using the conditions described in Example A. The coating was very adherent, and could not be scratched with a sharp piece of glass which could easily scratch the un-coated glass substrates. The coating exhibited a light yellow-blue reflected color on the sunglass lens, and a light blue reflected color on the glass plate.

EXAMPLE R

A 5.7"×5.7"×0.375" soda-lime, float glass plate was cleaned with soap and water followed by rinsing with isopropanol and drying with nitrogen gas. The glass plate was mounted onto a substrate holder which was in a vacuum chamber. The vacuum chamber was then evacuated to a pressure of $5\times10^{-6}$ Torr. Next, the sample was sputter-etched for 10 minutes with a beam of $Ar^+$ ions at an energy of 500 eV and a current density of 0.5 mA/cm². A 3000-Å layer of $SiO_2$ was then deposited by ion beam sputter deposition by bombarding a silica target with a beam of $N_2^+$ ions. Next a 1-micron layer of "silicon oxy-nitride" was deposited onto the glass plate by bombarding a Si target with a beam of $N_2^+$ ions in the presence of air. After deposition of the silicon oxy-nitride, a 100 Å thick layer of diamond-like carbon was deposited using a 11 cm ion beam source operated on methane gas at a pressure of $1.4\times10^{-4}$ Torr. The beam energy was 75 eV and the beam current density was 0.3 mA/cm². The coating was very adherent to the glass substrate.

EXAMPLE S

A 5.7"×5.7"×0.375" float glass substrate was cleaned and mounted in a vacuum chamber as in Example R. The chamber was evacuated to a pressure of $5\times10^{-6}$ Torr. The sample was ion beam sputter-etched as in Example R. Next, a 3000-Å $SiO_2$ layer was deposited as in Example R. Then, a 2-micron silicon oxy-nitride layer was deposited as described in Example R. Finally, a 100-Å DLC layer was deposited as in Example R. The coating was very adherent to the glass substrate.

EXAMPLE T

A 5.7"×5.7"×0.375" float glass substrate was cleaned and mounted in a vacuum chamber as in Example R. The chamber was evacuated to $4\times10^{-6}$ Torr. The sample was ion beam sputter-etched as in Example R. Next, a 3000-Å $SiO_2$ layer was deposited as in Example R. Then, a 3-micron silicon oxy-nitride layer was deposited as described in Example R. Finally, a 100-Å DLC layer was deposited as in Example R. The coating was very adherent to the glass substrate.

EXAMPLE U 5.7"×5.7"×0.375" float glass substrate was cleaned and mounted in a vacuum chamber as in Example R. The chamber was evacuated to $4\times10^{-6}$ Torr. The sample was ion beam sputter-etched as in Example R. Next, a 3000-Å $SiO_2$ layer was deposited as in Example R. Then, a 4-micron silicon oxy-nitride layer was deposited as described in Example R. A 100-Å DLC layer was deposited as in Example R. The coating was very adherent to the glass substrate.

17

EXAMPLE V

Four neutral gray tempered sunglass lenses were cleaned by the chemical cleaning procedure used in Example R. The lenses were subsequently mounted onto a graphite plate. One-half of the surface was masked. The graphite plate was then mounted in a vacuum chamber and the chamber was evacuated to $5 \times 10^{-6}$ Torr. The lenses were $Ar^+$ ion beam sputter-etched as in Example R. Then, a 3000-Å $SiO_2$ layer was deposited as in Example R. Next a 0.5-micron silicon oxy-nitride layer was deposited as in Example R. Finally, a 200-Å DLC layer was deposited as in Example R. The coating was very adherent to the sunglass lenses.

EXAMPLE W

Four tempered sunglass lenses were cleaned, mounted, and masked as in Example V. The graphite plate was then mounted in a vacuum chamber and the chamber was evacuated to $2 \times 10^{-6}$ Torr. The lenses were $Ar^+$ ion beam sputter-etched for as in Example R. A 3000-Å $SiO_2$ layer was deposited as in Example R. A 1 micron silicon oxy-nitride layer deposited as in Example R. A 200-Å DLC layer was deposited as in Example R. The coating was very adherent to the sunglass lenses.

EXAMPLE X

Four tempered sunglass lenses were cleaned, mounted, and masked as in Example W. The graphite plate was then mounted in a vacuum chamber and the chamber was evacuated to $4 \times 10^{-6}$ Torr. The lenses were $Ar^+$ ion beam sputter-etched for as in Example R. Next, a 3000-Å $SiO_2$ layer was deposited as in Example R. A 2-micron silicon oxy-nitride layer was deposited as in Example R. A 200-Å DLC layer was deposited as in Example R. The coating was very adherent to the sunglass lenses.

EXAMPLE Y

Four tempered sunglass lenses were prepared and coated as in Example X except the silicon oxy-nitride thickness was increased to 3 microns. The coating was very adherent to the sunglass lenses.

EXAMPLE Z

Four tempered sunglass lenses were prepared and coated as in Example V except the silicon oxy-nitride thickness was increased to 4 microns. The coating was very adherent to the sunglass lenses.

EXAMPLE AA

Four pieces of tempered float glass (5.25"×3.5"×0.25" thick) for use as windows in laser bar-code scanners were coated as follows. Each piece of float glass was ultrasonically cleaned with soap and water, rinsed with deionized water, and air dried. The glass plates were mounted onto a substrate holder which was placed into a vacuum chamber. The vacuum chamber was then evacuated to a pressure of approximately $6 \times 10^{-6}$ Torr. Next, the glass pieces were sputter-etched for 26 minutes with a beam of $Ar^+$ ions at an energy of 1000 eV and a current of 640 mA. A 3000-Å thick layer of $SiO_2$ was then deposited by reactive ion beam sputter deposition using a silicon sputtering target, and a background chamber pressure of $3.3 \times 10^{-4}$ Torr of air. For the $SiO_2$ deposition, the ion source working gas was air, and the source was operated at 1000 eV ion energy, and 450 mA

18 ion beam current. Next, a 4.2-micron thick layer of "silicon oxy-nitride" was deposited onto the glass plates by reactive ion beam sputter deposition using a silicon sputtering target. In this step, the ion source was operated on nitrogen gas (effective partial pressure of $1.1 \times 10^{-4}$ Torr), and the partial pressure of air introduced into the vacuum chamber was $3.3 \times 10^{-4}$ Torr, such that the total chamber pressure was $4.4 \times 10^{-4}$ Torr. After the deposition was complete, the coated windows were removed from the vacuum chamber. The coating was very adherent. The silicon oxy-nitride layer was much harder than the glass substrate. The Vickers microhardness of the silicon oxy-nitride coating on the glass window was approximately 1500 kg/mm$^2$, while the Vickers hardness of the glass substrate was approximately 550 kg/mm$^2$. After being rubbed with a sharp piece of glass, the coating exhibited many optical imperfections and defects, indicative of damage induced by galling or glass "welding" to the coating surface. The sliding friction between the sharp glass piece and the silicon oxy-nitride coated substrate was very high.

EXAMPLE BB

A low friction zirconium oxide layer was applied as a top coating to one of the coated glass plates from Example AA by the following procedure.

One of the silicon oxy-nitride-coated glass plates from Example AA was cleaned in isopropyl alcohol, air dried, partially masked with Kapton tape, and mounted onto a substrate holder in a high vacuum deposition chamber. After evacuating the chamber to a base pressure of $5 \times 10^{-6}$ Torr, the substrate was sputter-etched with a 500 eV $Ar^+$ ion beam, at a current of 137 mA for two minutes. Next a 75-Å thick layer of optically transparent zirconium oxide was deposited by reactive ion beam sputter deposition using a zirconium sputtering target, and a background chamber pressure of $3.0 \times 10^{-4}$ Torr of air, obtained from an air flow rate of 42 sccm. The sputter deposition ion source was operated on a nominal gas flow of 2 sccm of argon. The zirconium oxide coating was very adherent to the glass plate. When a sharp piece of glass was dragged across the interface between the silicon oxy-nitride layer and the zirconium oxide layer, the sliding friction across the silicon oxy-nitride layer was high, while the sliding friction across the zirconium oxide layer was low.

EXAMPLE CC

A low friction aluminum oxide layer was applied as a top coating to one of the coated glass plates from Example AA by the following procedure.

One of the silicon oxy-nitride-coated glass plates from Example AA was cleaned in isopropyl alcohol, air dried, partially masked with Kapton tape, and mounted onto a substrate holder in a high vacuum deposition chamber. After evacuating the chamber to a base pressure of $1 \times 10^{-6}$ Torr, the substrate was sputter-etched with a 500 eV Ar+ ion beam, at a current of 137 mA for two minutes. Next a 90-Å thick layer of optically transparent aluminum oxide was deposited by ion beam sputter deposition using an aluminum oxide sputtering target. The sputter deposition ion source was operated on a nominal gas flow of 7 sccm of argon. The aluminum oxide coating was very adherent to the glass plate. When a sharp piece of glass was dragged across the interface between the silicon oxy-nitride layer and the aluminum oxide layer, the sliding friction across the silicon oxy-nitride layer was high, while the sliding friction across the aluminum oxide layer was low.

EXAMPLE DD

A low friction carbon nitride layer was applied as a top coating to one of the coated glass plates from Example AA by the following procedure.

One of the silicon oxy-nitride-coated glass plates from Example AA was cleaned in isopropyl alcohol, air dried, partially masked with Kapton tape, and mounted onto a substrate holder in a high vacuum deposition chamber. After evacuating the chamber to a base pressure of $4.7 \times 10^{-6}$ Torr, the substrate was sputter-etched with a 500 eV Ar+ ion beam, at a current of 137 mA for two minutes. Next a 60-Å thick layer of substantially optically transparent carbon nitride was deposited by ion beam sputter deposition using a nitrogen ion beam and a graphite sputtering target. The sputter deposition ion source was operated on a nominal gas flow of 21 sccm of nitrogen. The carbon nitride coating was very adherent to the glass plate.

When a sharp piece of glass was dragged across the interface between the silicon oxy-nitride layer and the carbon nitride layer, the sliding friction across the silicon oxy-nitride layer was high, while the sliding friction across the carbon nitride layer was very low. The carbon nitride layer could not be scratched by a sharp piece of glass.

EXAMPLE EE

A low friction boron nitride layer was applied as a top coating to one of the coated glass plates from Example AA by the following procedure.

One of the silicon oxy-nitride-coated glass plates from Example AA was cleaned in isopropyl alcohol, air dried, partially masked with Kapton tape, and mounted onto a substrate holder in a high vacuum deposition chamber. After evacuating the chamber to a base pressure of $2.4 \times 10^{-6}$ Torr, the substrate was sputter-etched with a 500 eV Ar+ ion beam, at a current of 137 mA for two minutes. Next a 95-Å thick layer of optically transparent boron nitride was deposited by ion beam sputter deposition using a nitrogen ion beam and a boron nitride sputtering target. The sputter deposition ion source was operated on a nominal gas flow of 21 sccm of nitrogen. The boron nitride coating was adherent to the glass plate.

When a sharp piece of glass was dragged across the interface between the silicon oxy-nitride layer and the boron nitride layer, the sliding friction across the silicon oxy-nitride layer was high, while the sliding friction across the boron nitride layer was low.

EXAMPLE FF

A low friction indium tin oxide layer was applied as a top coating to one of the coated glass plates from Example AA by the following procedure.

One of the silicon oxy-nitride-coated glass plates from Example AA was cleaned in isopropyl alcohol, air dried, partially masked with Kapton tape, and mounted onto a substrate holder in a high vacuum deposition chamber. After evacuating the chamber to a base pressure of $4.7 \times 10^{-6}$ Torr, the substrate was sputter-etched with a 500 eV Ar+ ion beam, at a current of 137 mA for two minutes. Next a 100-Å thick layer of substantially optically transparent indium tin oxide was deposited by ion beam sputter deposition using an indium tin oxide sputtering target. The sputter deposition ion source was operated on a nominal gas flow of 7 sccm of argon. The indium tin oxide coating was adherent to the glass plate. When a sharp piece of glass was dragged across the interface between the silicon oxy-nitride layer and the indium tin oxide layer, the sliding friction across the silicon oxy-nitride layer was high, while the sliding friction across the indium tin oxide layer was low.

Specific examples of the use of thick interlayer(s) 2 with a thin DLC layer 3 were shown in Examples R–Z. In these Examples, the coated substrate products are supermarket laser bar code scanner windows designed to stop damage from impacting cans and bottles for a period of at least five years, and glass sunglass lenses designed to withstand severe abrasion by sand. In Examples R–Z, the glass substrates were coated with a first interlayer 2 of silicon dioxide, a second interlayer 2 of a chemical combination of silicon oxide and silicon nitride (so-called "silicon oxy-nitride") and finally a top layer of DLC. The silicon dioxide layer was several thousands of Å thick, the "silicon oxy-nitride" layer ranged in thickness from 0.5 micron to four microns, and the DLC layer thickness was 100 Å or 200 Å. In severe tests, the abrasion resistance was found to increase dramatically with the thickness of the silicon oxy-nitride interlayer.

Figure 4:
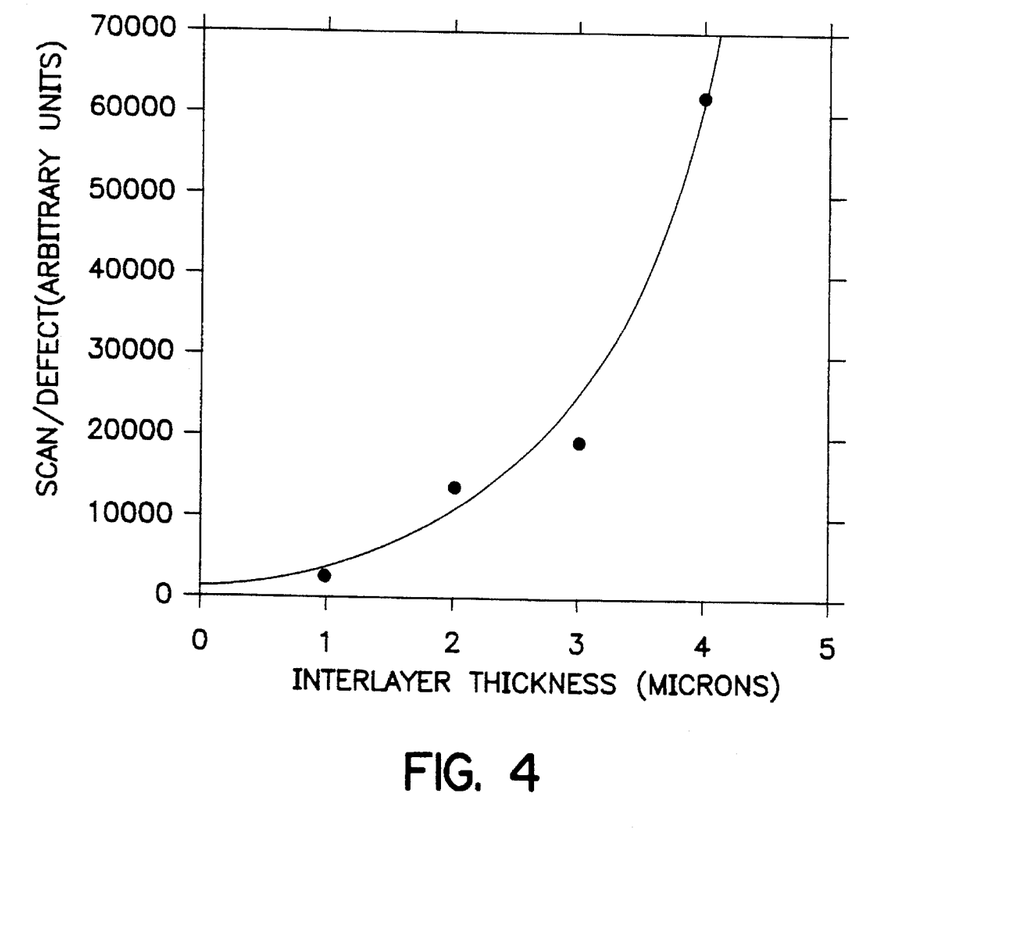
FIG. 4 is a graph of the ratio of scans per defect versus the interlayer thickness of the coating of a coated bar-code scanner window product in accordance with the present invention.

One particular example of the effect of the interlayer thickness on abrasion resistance is shown in FIG. 4. FIG. 4 shows results obtained from a Tagucchi study of diamond-like carbon coated bar-code scanner windows used in grocery stores. One of the parameters investigated in this study was the thickness of an interlayer of silicon oxy-nitride deposited onto a silicon dioxide interlayer which in turn was deposited onto a soda-lime float glass substrate. A 100 Å thick layer of DLC was deposited onto the silicon oxy-nitride (see Examples R–U). These coated windows were installed into a grocery store bar code scanner in which the number of items scanned over each window was recorded. At the end of the test, the windows were removed and the number of scratches visible to the unaided eye were counted. FIG. 4 is a plot of the number of items scanned across each window divided by the number of scratches observed on the window at the end of the test. It is desirable to increase the number of scans/defect in order to increase the lifetime of the window. FIG. 4 shows that increasing the silicon oxy-nitride layer from one to four microns thickness dramatically improves the abrasion resistance.

Analogous results were obtained for a similar coating structure on glass sunglass lenses. Lenses were produced with silicon oxy-nitride interlayers of 0.5, 1, 2, 3 and 4 microns thickness (see Examples V–Z). These lenses were then scratched with #2 quartz particles under an applied pressure of 33 pounds per square inch. This test simulates severe sand abrasion. For a silicon oxy-nitride thickness of 0.5 microns (Example V) significant damage to the substrate was observed. As the silicon oxy-nitride thickness was increased to 1 micron (Example W), the number of scratches penetrating the coating decreased dramatically, but a significant number of fine scratches which indented the substrate through the coating, but did not break through the coating were observed using an optical microscope. At a thickness of 2 microns (Example X), scratches which punctured the coating were not observed, but some indentation type scratches still occurred. At thickness of 3 and 4 microns (Example Y and Z, respectively) no indication of any type of scratch was observed by optical microscopy.

Examples R–Z, FIG. 4, and the sand abrasion tests showed that in severe abrasion tests, the abrasion resistance of the coated substrate product increases dramatically with the thickness of a hard, silicon oxy-nitride interlayer. These tests also demonstrate that the coating thickness required to achieve the desired degree of abrasion resistance is application specific.

Specific examples of the use of thick interlayers with thin, optically transparent, hard and low friction layers of zirconium oxide, aluminum oxide, and boron nitride, and substantially optically transparent, hard and low friction layers of carbon nitride and indium tin oxide are provided in Examples BB, CC, EE, DD, and FF, respectively. In each of these examples, glass substrates were coated with a first interlayer of silicon dioxide, a second interlayer of a chemical combination of silicon oxide and silicon nitride (so-called "silicon oxy-nitride") and finally a top layer of optically transparent, or substantially optically transparent, hard and low friction material. The coated substrate product in each of these Examples BB, CC, EE, DD, and FF is a laser bar code scanner window.

Example AA illustrates that a hard, thick silicon oxy-nitride coating alone is not sufficient to produce an abrasion-resistant coating on glass laser bar code scanner windows. This is because although the silicon oxy-nitride layer is very hard, it does not exhibit a low coefficient of friction against glass.

Examples BB, CC, DD, EE and FF illustrate that a variety of hard and low friction layers can be applied on top of the thick silicon oxy-nitride layer to produce a surface with a low coefficient of friction, and hence achieve a highly abrasion resistant coated substrate in accordance with the present invention.

From the foregoing description, one of ordinary skill in the art can easily ascertain that the present invention provides a novel method for producing a substantially optically transparent multilayer composite structure. A highly important technical advantage of the invention is that superior abrasion wear resistance is achieved by use of a multilayer transparent structure comprised of a parent substrate, one or more interlayers and a low friction outer layer.

Without departing from the spirit and scope of this invention, one of ordinary skill can make various changes and modifications to the invention to adapt it to various usages and conditions. As such, these changes and modifications are properly, equitably, and intended to be, within the full range of equivalents of the following claims.

What is claimed is:

1. A coated substrate product comprising:

a substantially optically transparent substrate which is transparent to light in the visible region of 350 to approximately 750 nanometers and which comprises a material selected from the group consisting of an amorphous material, a single crystal, polycrystalline materials, glass, salt materials, ceramic materials and mixtures thereof;

a silicon oxynitride interlayer that is substantially optically transparent to light in the visible region of 350 to approximately 750 nanometers; and an outer layer of substantially optically transparent, hard and low friction diamond-like carbon, which is transparent to light in the visible region of 350 to approximately 750 nanometers;

said interlayer being capable of forming a strong chemical bond to the diamond-like carbon layer.

2. A coated substrate product, as recited in claim 1, further comprising a silicon oxide layer disposed between said silicon oxynitride interlayer and said substrate.

3. A coated substrate product, as recited in claim 1, further comprising an aluminum oxide layer disposed between said silicon oxynitride interlayer and said substrate.

4. A coated substrate product comprised of a substantially optically transparent substrate which is transparent to light in the visible region of 350 to approximately 750 nanometers and which comprises a material selected from the group consisting of an amorphous material, a single crystal, polycrystalline materials, glass, salt materials, ceramic materials and mixtures thereof;

a composite layer comprising a chemically vapor deposited interlayer substantially optically transparent to light in the visible region of 350 to approximately 750 nanometers and having a hardness greater than the hardness of said substrate and an aluminum oxide or silicon oxide layer disposed between said interlayer and said substrate;

an outer layer of substantially optically transparent, hard and low friction diamond-like carbon which is transparent to light in the visible region of 350 to approximately 750 nanometers and is bonded to said composite layer and away from said substrate;

wherein said composite layer is capable of forming a strong chemical bond to said substrate and a strong chemical bond to the diamond-like carbon layer.

5. A product produced by the method comprising:

chemically vapor depositing over a glass substrate a substantially optically transparent interlayer devoid of alkali metal atoms and fluorine and selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof and chemically bonded combinations thereof, said interlayer being transparent to light in the visible region of 350 to approximately 750 nanometers, and adapted to form a strong chemical bond to said glass substrate; and chemically vapor depositing onto said interlayer an outer layer of a substantially optically transparent diamond-like carbon layer which is transparent to light in the visible region of 350 to approximately 750 nanometers, said interlayer further adapted to form a strong chemical bond to the diamond-like carbon layer.

6. A product produced by the method comprising:

chemically vapor depositing over a glass substrate a substantially optically transparent interlayer of silicon oxynitride, said interlayer being transparent to light in the visible region of 350 to approximately 750 nanometers, and adapted to form a strong chemical bond to said glass substrate; and chemically vapor depositing onto said interlayer an outer layer of a substantially optically transparent diamond-like carbon layer which is transparent to light in the visible region of 350 to approximately 750 nanometers, said interlayer further adapted to form a strong chemical bond to the diamond-like carbon layer.

* * * * *